United States Patent
Ponza et al.

(10) Patent No.: US 7,605,015 B2
(45) Date of Patent: Oct. 20, 2009

(54) PROCESS FOR THE SINGULATION OF INTEGRATED DEVICES IN THIN SEMICONDUCTOR CHIPS

(75) Inventors: Anna Ponza, Cornedo Vicentino (IT); Riccardo Depetro, Domodossola (IT); Pietro Montanini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 258 days.

(21) Appl. No.: 11/584,259

(22) Filed: Oct. 19, 2006

(65) Prior Publication Data

US 2007/0141809 A1    Jun. 21, 2007

Related U.S. Application Data

(63) Continuation of application No. PCT/EP2005/051694, filed on Apr. 18, 2005.

(30) Foreign Application Priority Data

Apr. 20, 2004    (IT)    .............. TO2004A000244

(51) Int. Cl.
*H01L 21/00*    (2006.01)
(52) U.S. Cl. .................. 438/53; 438/460
(58) Field of Classification Search ............. 438/48–55, 438/459–464

See application file for complete search history.

(56) References Cited

U.S. PATENT DOCUMENTS

| 5,466,630 | A | 11/1995 | Lur |
| 6,693,039 | B2 * | 2/2004 | Erratico et al. .............. 438/700 |
| 2003/0168711 | A1 | 9/2003 | Villa et al. |

FOREIGN PATENT DOCUMENTS

| EP | 1043770 A1 | 10/2000 |
| EP | 1324382 A1 | 7/2003 |

OTHER PUBLICATIONS

T. Overstolz et al., "A Clean Wafer-Scale Chip-Release Process Without Dicing Based on Vapor Phase Etching," 17th IEEE International Conference on Micro Electro Mechanical Systems, Jan. 2004, pp. 717-720.

T. Sato et al., "A New Substrate Engineering for the Formation of Empty Space in Silicon (ESS) Induced by Silicon Surface Migration," IEDM 1999, pp. 517-520.

* cited by examiner

*Primary Examiner*—Savitri Mulpuri
(74) *Attorney, Agent, or Firm*—Lisa K. Jorgenson; Robert Iannucci; Seed IP Law Group PLLC (57) ABSTRACT

A process for the fabrication of an integrated device in a semiconductor chip envisages: forming a semiconductor layer partially suspended above a semiconductor substrate and constrained to the substrate by temporary anchorages; dividing the layer into a plurality of portions laterally separated from one another; and removing the temporary anchorages, in order to free the portions.

29 Claims, 6 Drawing Sheets

PROCESS FOR THE SINGULATION OF INTEGRATED DEVICES IN THIN SEMICONDUCTOR CHIPS

BACKGROUND OF THE INVENTION

1. Field of the Invention

The present invention relates to a process for the fabrication of integrated devices in small-thickness semiconductor chips.

2. Description of the Related Art

As is known, customary techniques of fabrication of semiconductor integrated devices (typically micro-electromechanical circuits or devices) envisage providing a plurality of units identical to one another on the same semiconductor wafer. At the end of the process, the so-called "singling" is carried out, i.e., the wafer is divided into a plurality of portions (dice), each of which contains a respective device. Hereinafter, the portions obtained by cutting of a semiconductor wafer will be indicated for reasons of simplicity by the term "chips".

Normally, a saw is used to cut the wafer.

Prior to singling, the wafer is normally thinned out, so as to reduce as much as possible the thickness of the chips containing the finished devices. This operation enables various advantages to be achieved. In the first place, thin chips have a lower thermal capacitance and a higher thermal conductivity and hence enable a better heat dispersion, which is particularly important when the integrated devices in the chips dissipate high power levels. Furthermore, minimizing the dimensions of the chips in general enables a considerable reduction in the overall dimensions of the devices after packaging in the external protective structures, especially in the case of devices with a number of stacked chips. In some devices, moreover, the current can flow also between the front and rear faces of the chip (vertical-current-flow devices). In this case, the reduction of the thickness also involves a reduction in the electrical resistance and lower energy consumption.

Currently, semiconductor wafers are usually thinned out mechanically by grinding. In this way, however, the thickness cannot be reduced beyond a certain limit, because the wafer must in any case maintain a sufficient mechanical resistance both during thinning-out and in the final machining steps. In particular, the mechanical stresses in the grinding step and in the cutting step can bring about microcracks in the wafer, and the likelihood of damage is all the greater the smaller the thickness achieved. In practice, the final thickness of the wafer can hardly fall below 100 µm without a reduction in the yield of the process.

BRIEF SUMMARY OF THE INVENTION

One embodiment of the present invention is a process for the fabrication of integrated devices which will be free from the drawbacks described above.

One embodiment of the invention is a process for fabricating integrated devices in a semiconductor chip. The process includes: forming a semiconductor layer partially suspended above a semiconductor substrate and constrained to the substrate by temporary anchorages; dividing the layer into a plurality of portions laterally separated from one another; and removing the temporary anchorages to free the portions

BRIEF DESCRIPTION OF THE SEVERAL VIEWS OF THE DRAWINGS

For a better understanding of the invention, there are now described some embodiments, purely by way of non-limiting example and with reference to the attached drawings, in which.

DETAILED DESCRIPTION OF THE INVENTION

Figure 1:
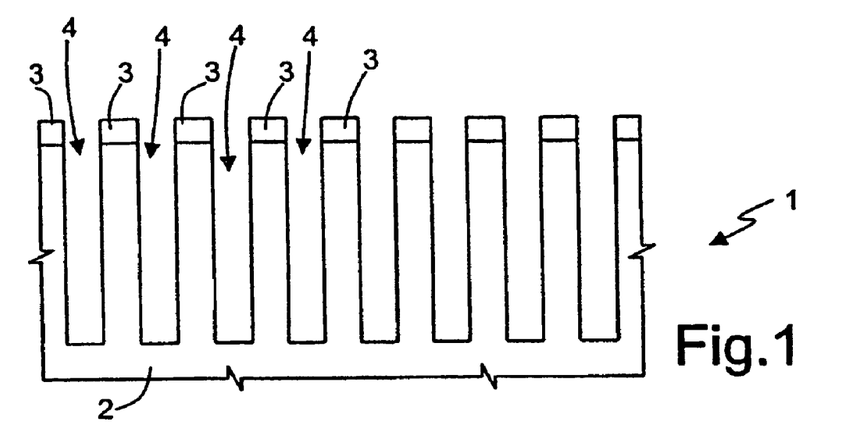
FIGS. 1-3 are cross-sectional views through a semiconductor wafer of the successive steps of fabrication according to a first embodiment of the present invention.
Figure 2:
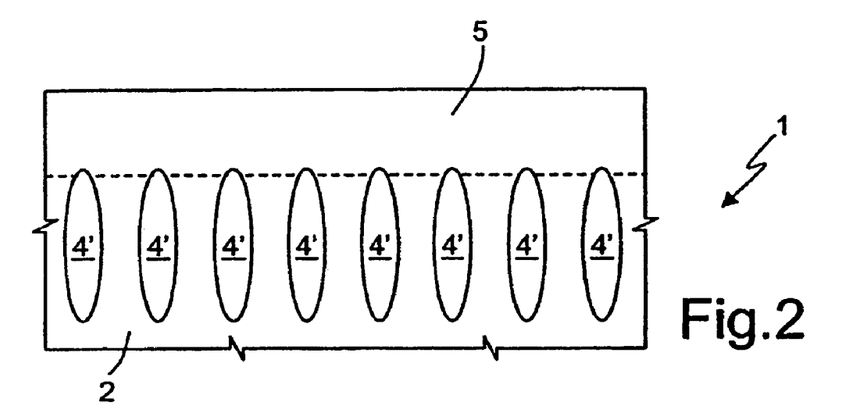
Figure 3:
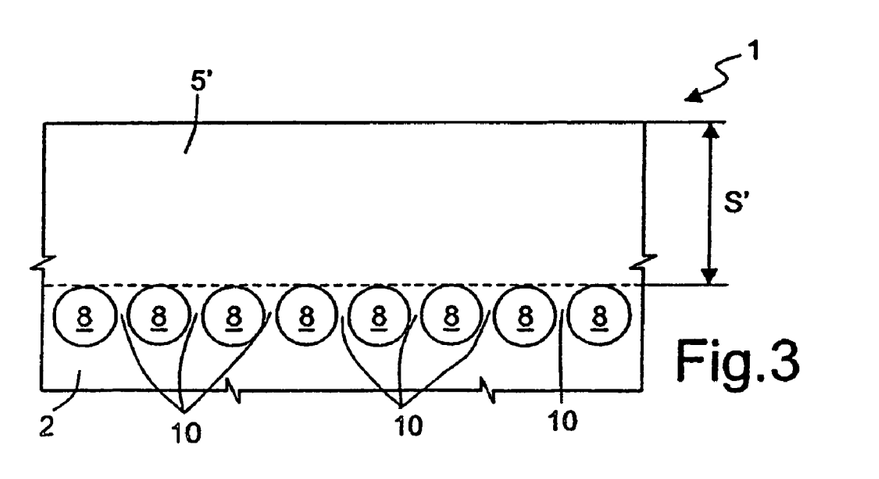

As illustrated in FIGS. 1-3, a semiconductor wafer 1 comprising a substrate 2, for example made of monocrystalline silicon, is subjected to initial steps of fabrication as described also in the U.S. Published Patent Application No. US2003168711, assigned to STMicroelectronics S.r.l.

In particular, (see FIG. 1) after a first mask 3 has been formed, the wafer 1 is etched anisotropically, and rectilinear deep trenches 4 are dug. The deep trenches 4 are adjacent and parallel to one another and extend in a direction perpendicular to the plane of the drawing. The first mask 3 is then removed, and an epitaxial layer 5 is grown, which closes the deep trenches 4 forming buried cavities 4', completely surrounded by silicon (FIG. 2). During the epitaxial growth, the silicon is deposited in part also inside the deep trenches 4, before they are closed, and hence the buried cavities 4' have a substantially elliptical cross section, with the major axis perpendicular to the surface 5a free from the epitaxial layer 5.

A thermal step of annealing is then carried out, in which the cross section of the buried cavities 4' is modified (FIG. 3). In practice, when the wafer 1 is heated in deoxidizing atmosphere, the surface silicon atoms that surround the buried cavities 4' migrate and tend to assume a minimum-energy configuration, as explained in the article "A New Substrate Engineering for the Formation of Empty Space in Silicon (ESS) Induced by Silicon Surface Migration" by T. Sato, N. Aoki, I. Mizushima, and Y. Tsunashima, IEDM 1999, pp. 517-520. For example, if the wafer 1 is heated at 1150° for 5 hours, the buried cavities 4' assume the shape of parallel buried channels 8, having a substantially circular cross section and separated from one another by silicon diaphragms 10. The width of the diaphragms 10 is determined both by the initial distance between immediately adjacent deep trenches 3, and by the duration of the annealing step. At the end of the annealing step, the channels 8 are overlaid by a structural silicon layer 5' having a thickness S that is determined by the duration of the step of epitaxial growth and by the duration of the annealing step. The thickness S is preferably comprised between 1 μm and 50 μm and, still more preferably, between 10 μm and 20 μm. Furthermore, the structural layer 5' is partially suspended above the substrate 2 and is constrained to the substrate 2 itself by means of the diaphragms 10, which function as temporary anchorages.

Figure 4:
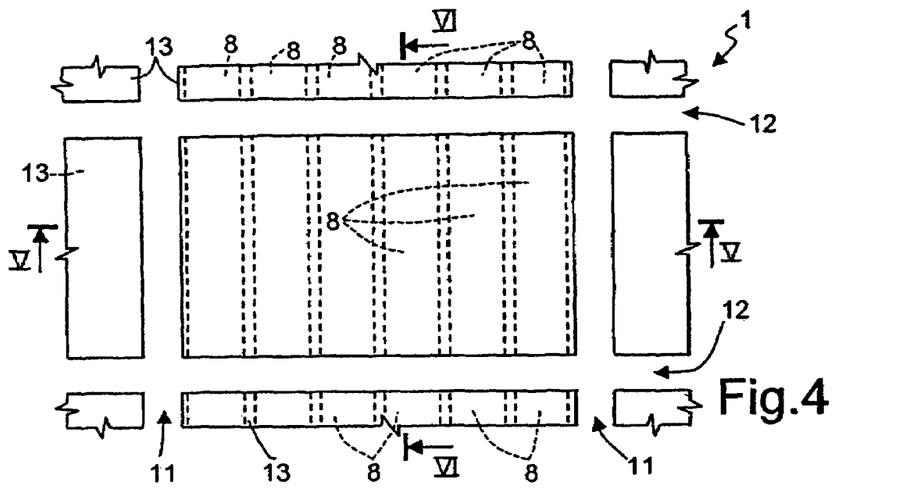
FIG. 4 is a top plan view of the semiconductor wafer illustrated in FIG. 3, in a subsequent machining step.
Figure 5:
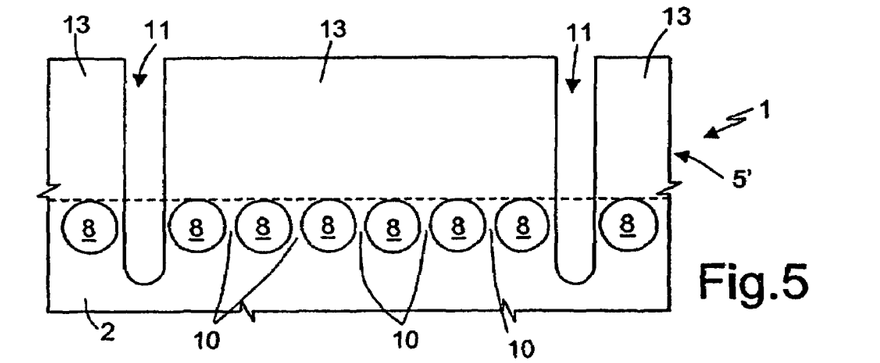
FIG. 5 is a cross-sectional view of the wafer of FIG. 4, taken according to the line V-V of FIG. 4.
Figure 6:
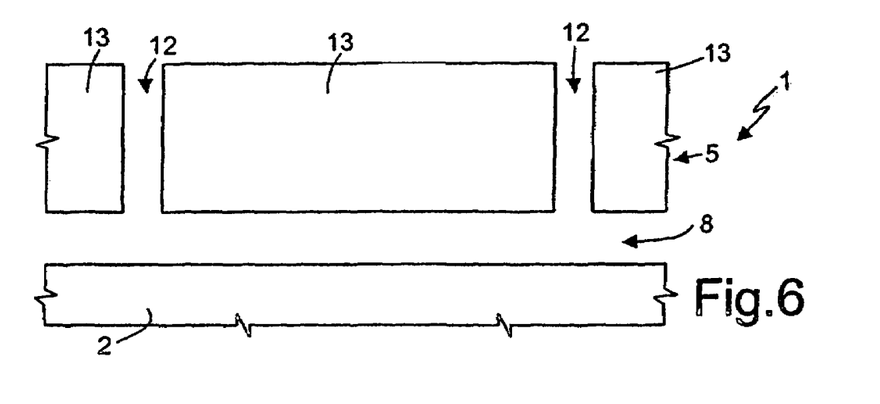
FIG. 6 is a cross-sectional view of the wafer of FIG. 4, taken according to the line VI-VI of FIG. 4.

As illustrated in FIGS. 4-6, first and second service trenches 11, 12 are then dug, which have a depth equal at least to the thickness S of the structural layer 5' so as to reach the buried channels 8, and are preferably slightly deeper. In practice, then, the channels 8 are accessible from the outside through at least some of the service trenches 11, 12, when the latter are free. The first service trenches 11 are parallel to the channels 8, whereas the second service trenches 12 are substantially perpendicular thereto. Furthermore, the first and second service trenches 11, 12 intersect one another forming a grid and laterally delimit portions 13 of the structural layer 5', which are then to be separated by the substrate 2 to form respective semiconductor chips. In this step of the process, the portions 13 are laterally isolated from one another by the trenches 11, 12 and are connected to the substrate 2 by means of the diaphragms 10. Furthermore, the portions 13 are partially suspended above the substrate 2.

Figure 7:
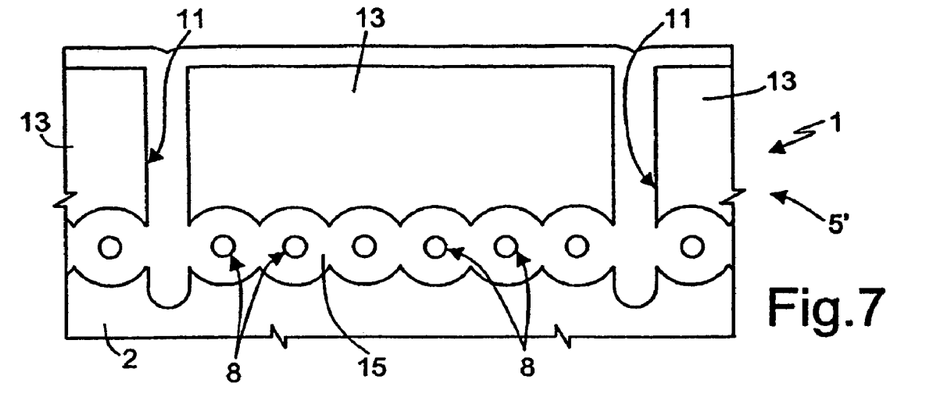
FIG. 7 is the same view as that of FIG. 5, in a subsequent step of the process.
Figure 8:
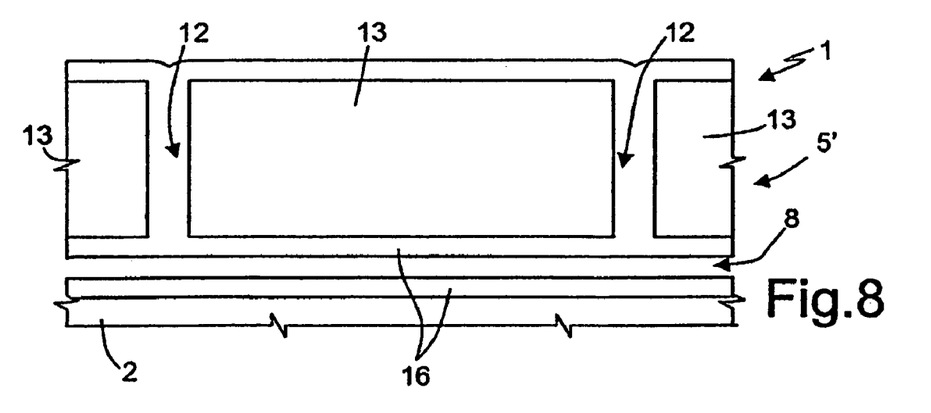
FIG. 8 is the same view as that of FIG. 6, in a subsequent step of the process.

Next, the wafer 1 is thermally oxidized for a first controlled time interval, as illustrated in FIGS. 7 and 8. In this step, the service trenches 11, 12 are filled, and the walls of the channels 8 are coated with an oxide layer 15. Since the oxide layer 15 grows both towards the inside of the channels 8 and within the silicon, the duration of the step of thermal oxidation, i.e., the first time interval, is controlled in such a way that the diaphragms 10 are completely oxidized, without however occluding the channels 8.

Figure 9:
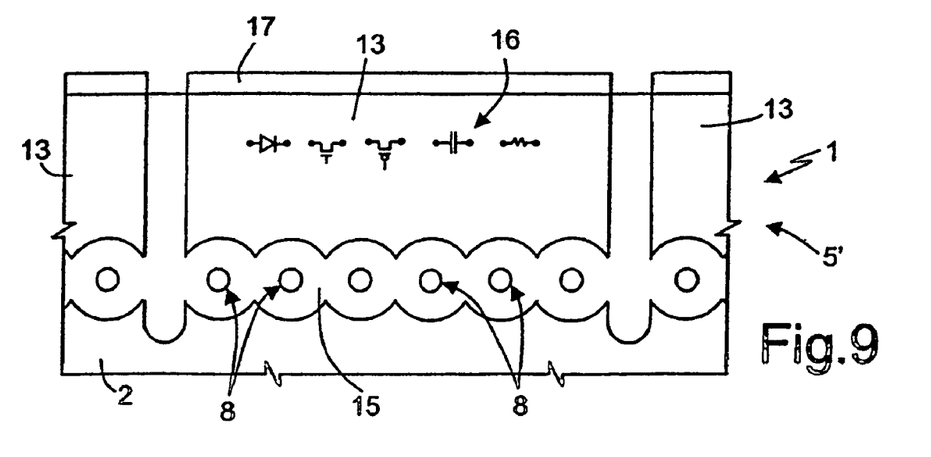
FIGS. 9 and 10 show the same view as that of FIG. 7 in subsequent machining steps.

After removing the oxide from the surface of the wafer 1 (FIG. 9), standard manufacturing steps are performed to provide a respective device 16 in each of the portions 13 of the structural layer 5'. In FIG. 9, the devices 16 have been schematically illustrated using electrical symbols of active and passive components. In practice, the devices 16 can be of any type that may be integrated in a semiconductor chip, such as for example micro-electromechanical circuits or structures. The corresponding fabrication steps can be standard steps of fabrication of any type of semiconductor devices and may comprise, for example, masking, implantation, diffusion, etching, deposition and growth of layers, metallizations, etc.

After the devices 16 have been completed, the wafer 1 is protected with a second photoresist mask 17, which leaves exposed only the first and second service trenches 11, 12, which are still filled with oxide.

Figure 10:
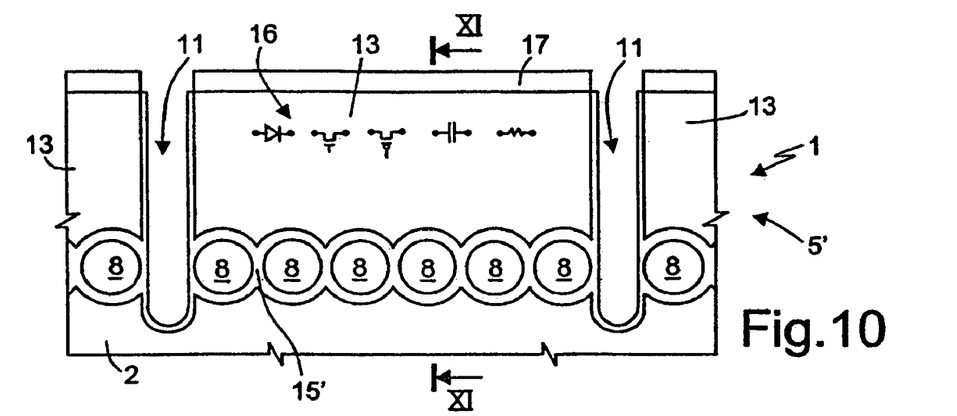
Figure 11:
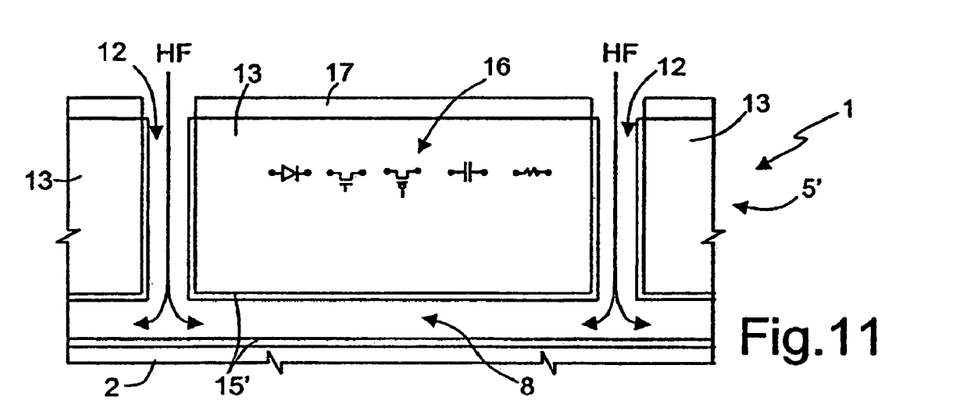
FIG. 11 is a cross-sectional view of the wafer of FIG. 10, taken according to the line XI-XI of FIG. 10.

The wafer 1 is then etched in a bath or in vapors of hydrofluoric acid HF for a second controlled time interval. During this step, initially the first and second trenches 11, 12 are freed from the oxide, which is selectively removed, laterally isolating once again the portions 13 of the structural layer 5'. Then, also the buried channels 8 are made accessible from the outside through at least the second service trenches 12. Consequently, the hydrofluoric acid HF can reach and etch the oxide layer (designated by 15' in FIGS. 10 and 11 is a residual oxide layer, which remains after etching). The service trenches 11, 12 hence perform the dual function of delimiting laterally the portions 13 of the structural layer 5' and of providing an access from the outside to the buried channels 8 for etching of the oxide layer 15'.

The step of etching with hydrofluoric acid HF is interrupted before the residual oxide layer 15' is completely removed and, in particular, before the portions 13 of the structural layer 5' are separated from the substrate 2. In practice, in this step, the residual oxide layer 15' functions as a temporary anchorage for the portions 13 of the structural layer 5', but it is weakened with respect to the silicon diaphragms 10.

Figure 12:
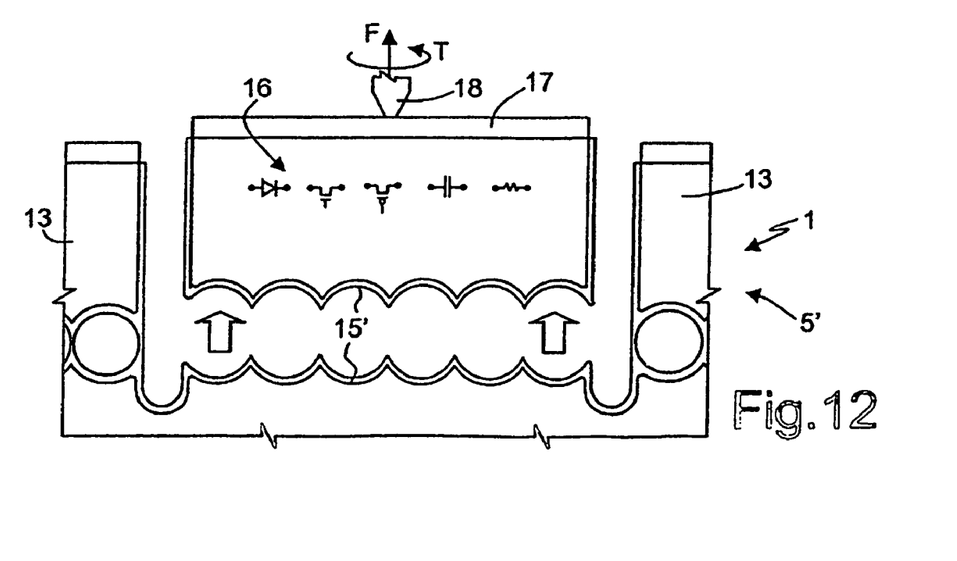
FIG. 12 shows the same view as that of FIG. 10, in a subsequent machining step.

After steps of testing of the devices 16, the portions 13 of the structural layer 5' are separated from the substrate 2 by a mechanical action (FIG. 12). More precisely, in succession on each portion 13 of the structural layer 5' a force F is applied, which is directed perpendicularly to the surface of the wafer 1 and is has a sufficient intensity to overcome the mechanical resistance of the residual oxide layer 15'. The residual oxide layer 15' fails where it is weaker, i.e., substantially along a median plane of the buried channels 8 parallel to the surface of the wafer 1. Preferably, together with the force F, a torque T is applied, which facilitates failure of the residual oxide layer 15'. The mechanical action for separating the portions 13 from the substrate 2 can be obtained conveniently using vacuum pipettes 18, of the type commonly used for picking up the chips singled out after the operations of traditional cutting (pick-and-place operation).

Figure 13:
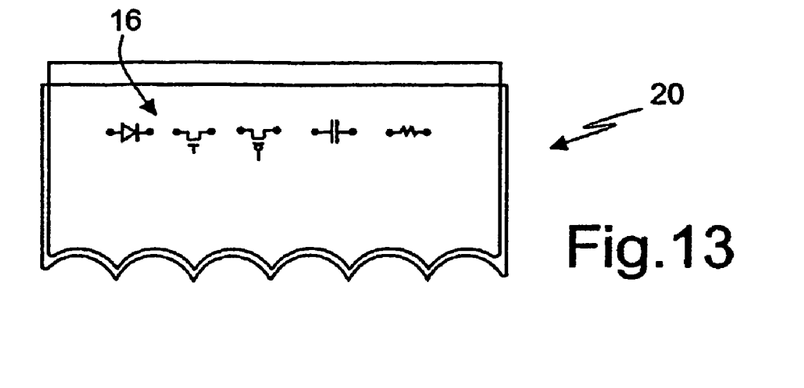
FIG. 13 is a side view of a chip obtained starting from the wafer of FIG. 12.

Chips 20 are thus obtained, each of which contains a respective device 16, as illustrated in FIG. 13. The chips 20 have substantially the thickness S determined by the steps of epitaxial growth and of annealing of the silicon. The chips 20 are finally packaged in purposely provided protective structures equipped with contact pins, according to conventional process steps (not illustrated herein).

Advantageously, then, it is possible to obtain chips of extremely contained thickness, even less than 10 μm, without increasing appreciably the risks of microcracks in the wafer during its fabrication. Instead, the yield can be increased. In traditional processes, in fact, the portions of the initial wafer which are then to form the chips must be arranged at a distance apart from one another by an amount sufficient to enable passage of the cutting saw without any damage to the integrated devices, in practice at least 60-100 μm. According to one embodiment of the invention, instead, the service trenches are sufficient to guarantee lateral separation between the portions which are then to form the chips and can have a width even of just 1 μm. The density is hence much greater, and it is possible to increase the number of chips per wafer.

Figure 14:
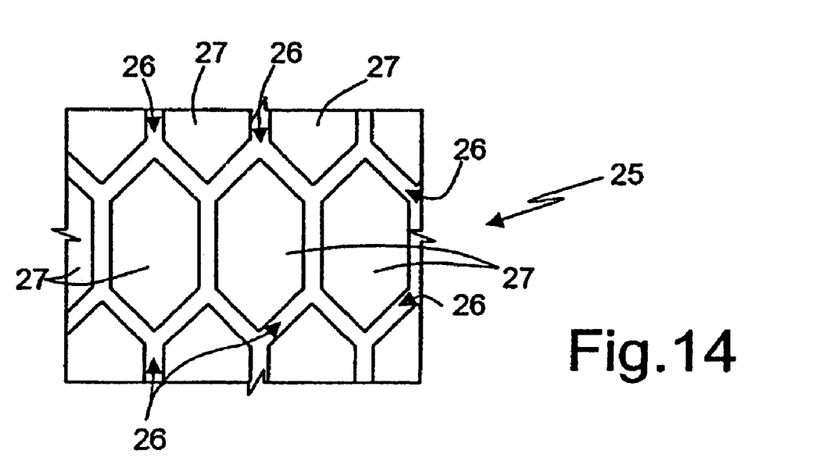
FIGS. 14 and 15 are top plan views of a second semiconductor wafer and a third semiconductor wafer, in intermediate steps of fabrication of processes according to a second embodiment and a third embodiment, respectively, of the present invention.
Figure 15:
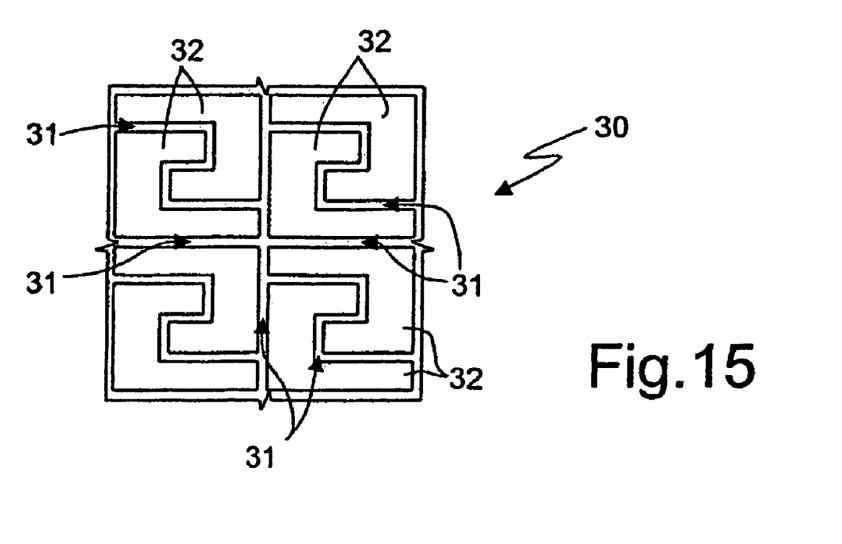

The above-described process overcomes another limitation of traditional processes, which are tied to rectilinear cutting paths and consequently exclusively enable square or, at the most, rectangular chips to be obtained. According to the process described, instead, the shape of the chips is defined by the service trenches, which can extend in any pattern. Consequently, also the chips can have any appropriate shape. For example, FIGS. 14 and 15 illustrate two alternative embodiments of the process. In the embodiment of FIG. 14, in a wafer 25 service trenches 26 are dug, which delimit hexagonal chips 27. FIG. 15 shows, instead, a wafer 30, in which service trenches 31 have been dug, which delimit C-shaped chips 32.

Figure 16:
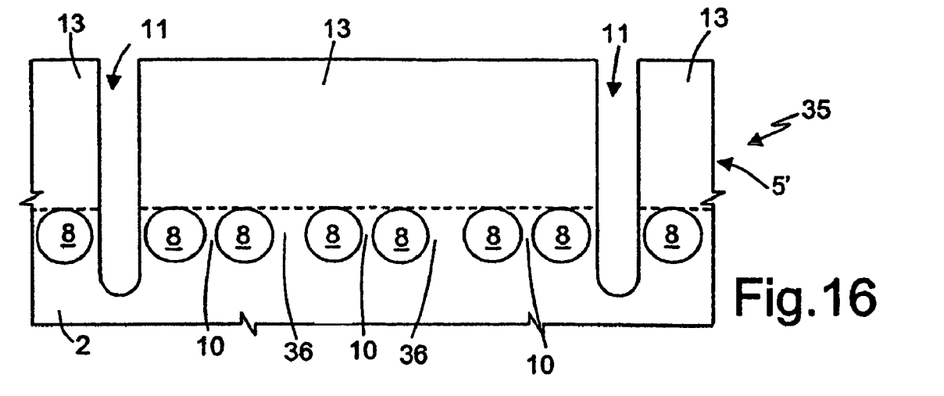
FIG. 16-18 are cross-sectional views through a semiconductor wafer in successive machining steps according to a fourth embodiment of the process according to the present invention.
Figure 17:
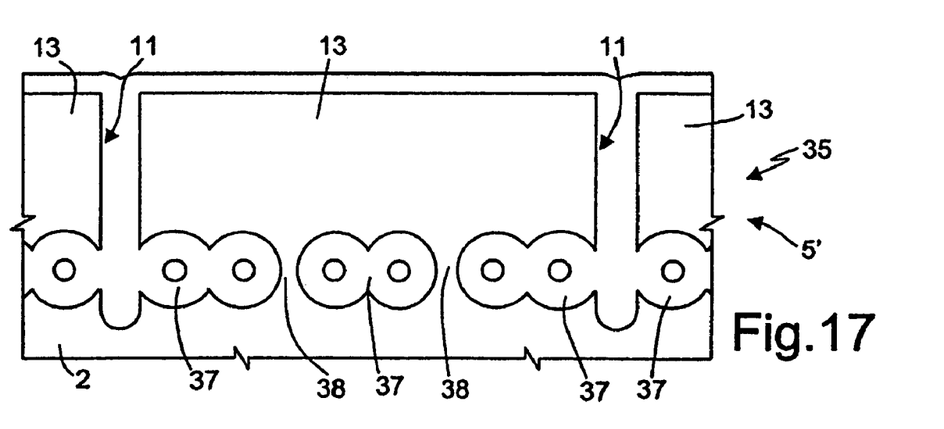
Figure 18:
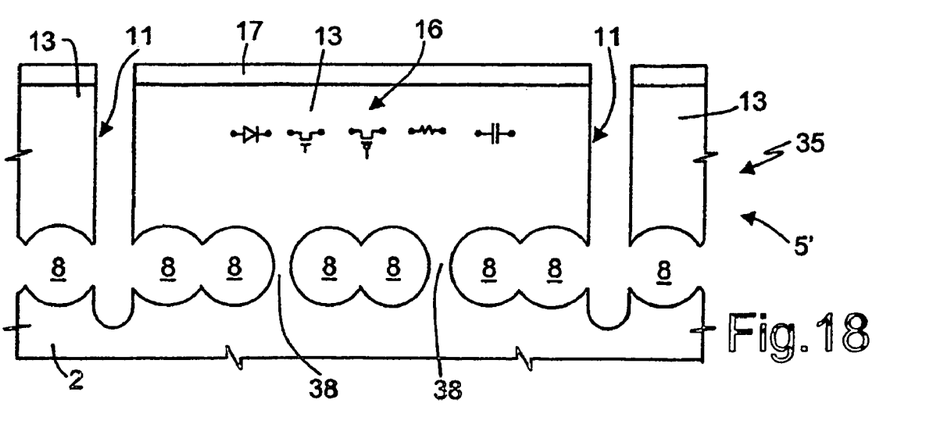

According to a further embodiment of the invention, illustrated in FIGS. 16-18, in which parts that are the same as the ones already illustrated are designated by the same reference numbers, in a wafer 35 some adjacent channels 8 are separated by diaphragms 36 having a width greater than that of the diaphragms 10. During the step of thermal oxidation (FIG. 17), in which oxide layers 37 are formed, the diaphragms 36 are thinned out, but not completely oxidized, so as to form thin temporary silicon anchorages 38. In the subsequent etching step with hydrofluoric acid HF, which is performed after the devices 16 have been made, the oxide layer 37 is removed completely, and the portions 13 of the structural layer 5' remain constrained to the substrate 2 through the temporary anchorages 38 (FIG. 18). In the final step of singling of the chips, the temporary anchorages 38 are broken by applying the force F and, possibly, the torque T, as explained previously.

In this way, a smaller precision in the control of the duration of the etching with hydrofluoric acid HF is required.

It should be noted that the temporary-anchorage silicon structures may have any suitable shape so as to present a controlled mechanical resistance (for example, they could be pillars).

Finally, it is clear that modifications and variations can be made to the process described, without departing from the scope of the present invention as defined in the annexed claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A process comprising:
    making a plurality of buried cavities by steps including forming a semiconductor layer partially suspended above a semiconductor substrate and constrained to said substrate by temporary anchorages;
    dividing said layer into a plurality of portions laterally separated from one another; and
    removing said temporary anchorages in order to free said portions.

2. The process according to claim 1, comprising weakening said temporary anchorages prior to beginning the removing step.

3. The process according to claim 2, wherein the weakening comprises oxidizing at least partially said temporary anchorages.

4. The process according to claim 3, wherein the weakening comprises chemically etching oxidized portions of said temporary anchorages.

5. The process according to claim 4, wherein said etching comprises using hydrofluoric acid and has a controlled duration.

6. The process according to claim 1, wherein said removing comprises breaking said temporary anchorages by a mechanical action.

7. The process according to claim 1, wherein said dividing comprises digging service trenches delimiting said portions and having a depth at least equal to a thickness of said layer.

8. The process according to claim 1, wherein said dividing comprises digging service trenches delimiting said portions and having a depth at least equal to a thickness of said layer, and wherein said buried cavities are accessible from outside through at least some of said service trenches.

9. The process according to claim 1, further comprising weakening said temporary anchorages by oxidizing at least partially said temporary anchorages, wherein said step of oxidizing is interrupted before said buried cavities are obstructed.

10. The process according to claim 1, wherein said step of making a plurality of buried cavities comprises:
    opening a plurality of adjacent deep trenches within said substrate;
    growing an epitaxial layer so as to close said deep trenches, the semiconductor layer including the epitaxial layer; and
    carrying out an annealing step.

11. A process for fabricating an integrated semiconductor device, comprising:
    forming a semiconductor layer above a semiconductor substrate;
    forming temporary anchorages supporting the semiconductor layer on the substrate; and
    removing the temporary anchorages by a mechanical action.

12. The process according to claim 11, further comprising weakening the temporary anchorages prior to beginning the removing step.

13. The process according to claim 12, wherein the weakening comprises at least partially oxidizing the temporary anchorages.

14. The process according to claim 13, wherein the weakening comprises chemically etching oxidized portions of the temporary anchorages.

15. The process according to claim 11, comprising making a plurality of buried cavities by steps including the step of forming the semiconductor layer, the temporary anchorages being positioned between the buried cavities.

16. The process according to claim 15, further comprising digging service trenches having a depth at least equal to a thickness of the semiconductor layer, and wherein the buried cavities are accessible from outside through at least some of the service trenches.

17. The process according to claim 15, further comprising weakening the temporary anchorages by oxidizing at least partially the temporary anchorages, wherein the step of oxidizing is interrupted before the buried cavities are completely obstructed.

18. The process according to claim 15, wherein the step of making a plurality of buried cavities comprises:
    opening a plurality of adjacent deep trenches within the substrate;
    growing an epitaxial layer so as to close the deep trenches, the semiconductor layer including the epitaxial layer; and
    carrying out an annealing step.

19. A process for the fabrication of integrated devices in a semiconductor chip, comprising:
    making a plurality of buried cavities by steps including forming a semiconductor layer partially suspended above a semiconductor substrate and constrained to the substrate by temporary anchorages between the cavities;
    dividing the layer into a plurality of portions laterally separated from one another; and
    removing the temporary anchorages in order to free the portions.

20. The process according to claim 19, comprising weakening the temporary anchorages prior to beginning the removing step.

21. The process according to claim 20, wherein the weakening comprises oxidizing at least partially the temporary anchorages.

22. The process according to claim 21, wherein the weakening comprises chemically etching oxidized portions of the temporary anchorages.

23. The process according to claim 19, wherein the removing comprises breaking the temporary anchorages by a mechanical action.

24. The process according to claim 19, wherein the dividing comprises digging service trenches delimiting the portions and having a depth at least equal to a thickness of the layer.

25. The process according to claim 19, further comprising weakening the temporary anchorages by oxidizing at least partially the temporary anchorages, wherein the oxidizing is interrupted before the buried cavities are obstructed.

26. The process according to claim 19, wherein the making a plurality of buried cavities comprises:
   opening a plurality of adjacent deep trenches within the substrate;
   growing an epitaxial layer so as to close the deep trenches, the semiconductor layer including the epitaxial layer; and
   carrying out an annealing step.

27. A process for the fabrication of integrated devices in a semiconductor chip, comprising the steps of:
   forming a semiconductor layer partially suspended above a semiconductor substrate and constrained to said substrate by temporary anchorages;
   dividing said layer into a plurality of portions laterally separated from one another; and
   removing said temporary anchorages in order to free said portions, wherein said removing comprises breaking said temporary anchorages by a mechanical action.

28. The process according to claim 27, comprising making a plurality of buried cavities by steps including the step of forming the semiconductor layer, wherein said dividing comprises digging service trenches delimiting said portions and having a depth at least equal to a thickness of said layer, and wherein said buried cavities are accessible from outside through at least some of said service trenches.

29. The process according to claim 1, comprising making a plurality of buried cavities by steps including the step of forming the semiconductor layer, wherein said step of making a plurality of buried cavities comprises:
   opening a plurality of adjacent deep trenches within said substrate;
   growing an epitaxial layer so as to close said deep trenches, the semiconductor layer including the epitaxial layer; and
   carrying out an annealing step.

* * * * *